United States Patent
Siegel et al.

(10) Patent No.: US 7,504,152 B1
(45) Date of Patent: Mar. 17, 2009

(54) CARBON NANOTREES FORMED BY FLASH CVD METHOD

(75) Inventors: Richard W. Siegel, Menands, NY (US); John M. Nugent, Schenectady, NY (US); Pulickel M. Ajayan, Clifton Park, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 623 days.

(21) Appl. No.: 10/781,460

(22) Filed: Feb. 17, 2004

Related U.S. Application Data

(62) Division of application No. 09/809,883, filed on Mar. 16, 2001, now abandoned.

(51) Int. Cl.
*B32B 5/16* (2006.01)
(52) U.S. Cl. .................... 428/402; 977/773; 977/777
(58) Field of Classification Search ............ 428/402; 977/773, 777
See application file for complete search history.

(56) References Cited

U.S. PATENT DOCUMENTS

| | | | | |
|---|---|---|---|---|
| 4,863,798 A | * | 9/1989 | Arenz et al. | 428/368 |
| 5,227,331 A | * | 7/1993 | Westmoreland | 438/680 |
| 5,350,545 A | * | 9/1994 | Streckert et al. | 156/89.27 |
| 5,471,946 A | * | 12/1995 | Scholz et al. | 117/84 |
| 6,121,061 A | * | 9/2000 | Van Bilsen et al. | 438/14 |

FOREIGN PATENT DOCUMENTS

EP 499004 * 8/1992

OTHER PUBLICATIONS

C.W., "Heat spurs growth of tiny carbon tree", Science News 2000, Mar. 25, 2000, vol. 157, No. 13, p. 207.*
Kiselev et al., "Carbon micro- and nanotubes synthesized by PE-CVD technique: Tube structure and catalytic particles crystallography", Science Direct, Carbon 42 (2004) 149-161.*
Ajayan, Nugent, Siegel, Wei, & Kohler-Redlich, "Growth of carbon micro-trees", Nature, vol. 404, Mar. 16, 2000, 243.*
Gleizes, MOCVD of Chalcogenides, Pnictides, and Heterometallic Compounds from Single-Source Molecule Precursors, Chem. Vap. Deposition, 6, No. 4, 2000, pp. 155-173.*
Franklin and Dai, "An Enhanced CVD Approach to Extensive Nanotube Networks with Directionality", Adv. Mater, 2000, 12, No. 12, pp. 890-894.*
A. Krishnan et al., "Graphitic Cones and Nucleation of Curved Carbon Surfaces", Nature, vol. 388, Jul. 31, 1997, pp. 451-454.
Thomas W. Ebbesen, "Cones and Tubes: Geometry in the Chemistry of Carbon", Accounts of Chemical Research, vol. 31, No. 8, 1998, pp. 558-566.

* cited by examiner

*Primary Examiner*—H. (Holly) T Le
(74) *Attorney, Agent, or Firm*—Heslin Rothenberg Farley & Mesiti P.C.

(57) ABSTRACT

A flash CVD process can be employed to grow micron- and nano-sized tree-like structures, particularly carbon structures on graphite electrodes. This process involves fast cyclic resistive heating of electrodes in an atmosphere of inert gas and hydrocarbons at below atmospheric pressure.

8 Claims, 7 Drawing Sheets

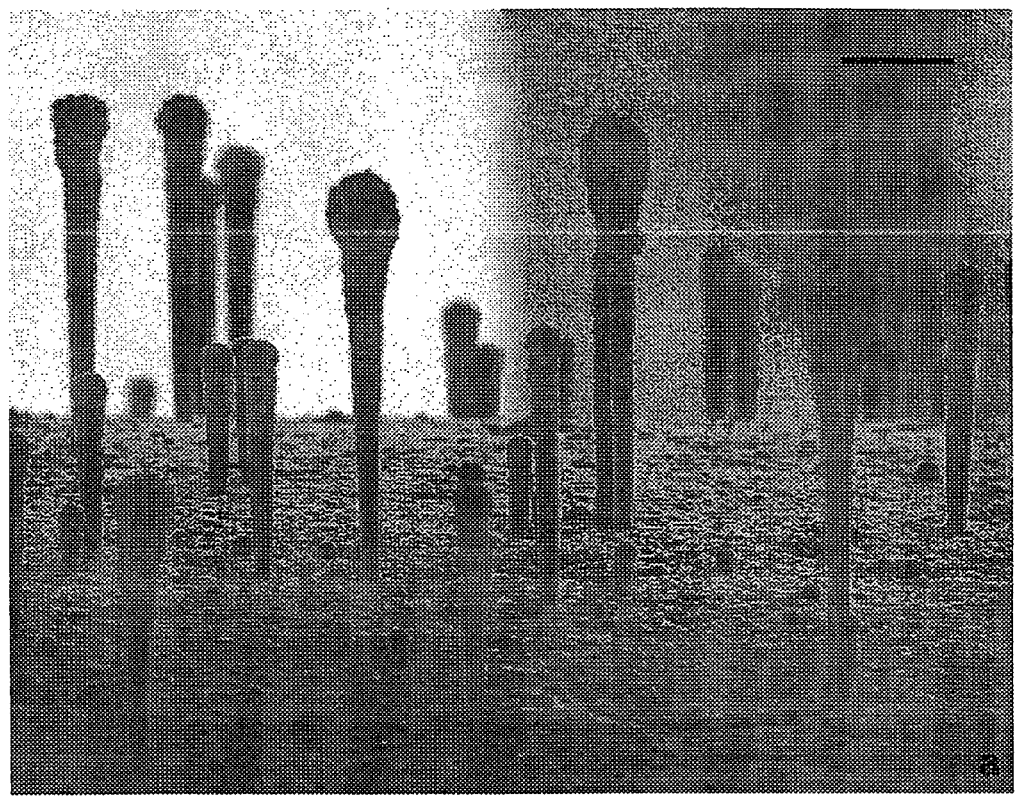
FIG. 1A
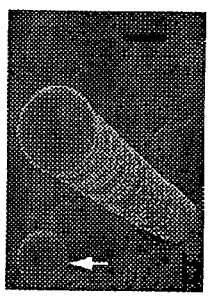  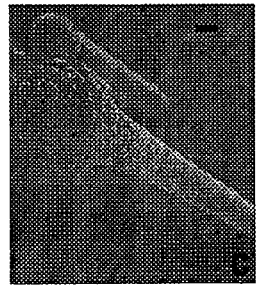  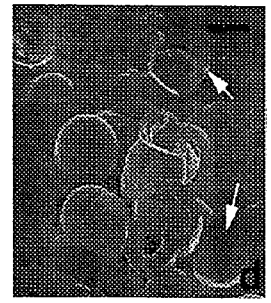
FIG. 1B  FIG. 1C  FIG. 1D

CARBON NANOTREES FORMED BY FLASH CVD METHOD

CROSS REFERENCE TO RELATED APPLICATIONS

This application is a divisional of U.S. Ser. No. 09/809,883, filed Mar. 16, 2001, entitled Flash CVD Process for Synthesis of Carbon Nanotrees, the entire disclosure of which is incorporated herein by reference.

STATEMENT AS TO RIGHTS UNDER FEDERALLY SPONSORED RESEARCH

This invention was made with support from a National Science Foundation CAREER grant (Ajayan) under Grant No. DMR-9733028. The United States government may have certain rights in the invention.

FIELD OF THE INVENTION

The invention relates to chemical vapor deposition processes for fabrication of treelike microstructures and nanostructures, and to these microstructures and nanostructures.

BACKGROUND OF THE INVENTION

Chemical vapor deposition (CVD) has been used for decades to make thin films, fibers and bulk materials used in a range of applications. Modifications of CVD, for example, plasma enhanced CVD, have been used to create unique structures by varying process parameters.

There remains a need, however, for improved CVD methods to produce materials with unusual structures and morphologies, and resulting interesting atypical properties. In particular, there is a need for a method which is capable of producing non-equilibrium, deeply metastable structures.

SUMMARY OF THE INVENTION

It has been unexpectedly found that rapid, intermittent variation of CVD process parameters and/or conditions can stabilize structures that will not grow under normal processing conditions. By using such methods, unique thin film architectures, abnormally grown grain structures, highly corrugated surfaces, unique fibrous morphologies, and novel alloy films, which normally show no solid solubility, may be manufactured.

Therefore, in one aspect, the present invention relates to a CVD process termed "flash" because of the short time periods employed. The process includes admitting one or more source precursor gases into a reaction chamber suitable for CVD; heating a substrate to a temperature greater than or equal to a decomposition temperature of the one or more source precursor gases, over a period of time ranging from 3 seconds to 300 seconds; and contacting the substrate with the one or more source precursor gases. The source precursor gas(es) is thereby decomposed on the substrate.

In another aspect, the present invention relates to particles having a unique configuration that may be synthesized by the flash CVD process of the invention. The particles are composed of base portion having the shape of an inverted truncated right circular cone. The diameter of the cone ranges from 1 nm to 100 microns and the height of the inverted truncated right circular cone ranges from 5 nm to 1000 microns. The particles may be composed of a material capable of forming one of a planar array, a two-dimensional lattice, or a nanotube. These materials may be, in particular, carbon, hexagonal BN; $B_xC_y$, where x and y are independently 0, 1, 2, 3 or 4; $B_xC_yN_z$ where x, y and z are independently 0, 1, 2, 3 or 4; a dichalcogenide; a metal oxide; a metal boride; or a combination thereof. More particularly, the materials may be carbon, $MOS_2$, $WS_2$, $V_2O_5$, $MoO_3$, $MgB_2$ or a combination thereof.

BRIEF DESCRIPTION OF THE DRAWINGS

FIGS. 1A-1H are micrographs showing carbon microtrees deposited on a graphite surface.

DETAILED DESCRIPTION OF THE INVENTION

Figure 1E:
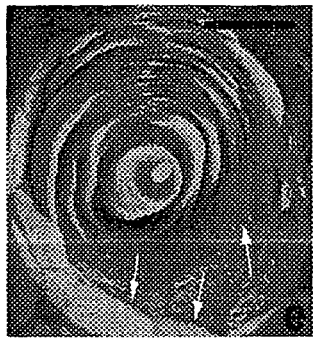

In one embodiment, the present invention relates to a CVD process in which a substrate is rapidly heated to a temperature greater than or equal to the decomposition temperature of the source precursor gases. In this context, 'rapidly' means over a time period ranging from 3 seconds to 300 seconds; heating rates are typically 200-300° C./second. During the process, a source precursor gas is admitted into the reaction chamber; contact with the surface of the heated substrate causes the precursor gas(es) to decompose on the substrate.

This 'flash' CVD process is distinguished from prior art CVD processes in that the substrate is heated extremely rapidly. The process, based on the concept of transient processing conditions, may be used to create non-equilibrium, deeply metastable structures, and may stabilize structures which do not grow under normal processing conditions. Unique thin film architectures, abnormal grain structures, highly corrugated surfaces, unique fibrous morphologies and alloy films which normally show no solid solubility are examples of structures that may be fabricated using the processes of the present invention. As one particular example, it has been discovered that micron-size tree-like carbon structures may be grown on graphite substrates by a flash CVD process.

During the process, a substrate is disposed within a reactor suitable for CVD, such as a standard CVD reactor or an electric-arc discharge chamber, typically under reduced pressure. In a process for the production of the carbon structures mentioned above, a graphite electrode may be used as the substrate. A suitable carbon source precursor is methane; other hydrocarbons may also be used, as is known in the art. The substrate is rapidly heated to the processing temperature; the heating period may range from 3 seconds to 300 seconds, particularly from 10 seconds to 100 seconds, and more particularly, from 20 seconds to 30 seconds. An electrically conductive material such as graphite may be resistively heated. This heating method can produce very high temperatures in a very short period of time, as for carbon deposition under flash conditions. Other rapid heating methods known in the art may be used, for graphite substrates and for nongraphite substrates. Processing temperatures should be no lower than the approximate decomposition temperature of the source precursor, since no deposition occurs below that temperature. Higher temperatures may be used. Where methane is the source precursor, the final temperature of the substrate typically ranges from about 900° C. to 2500° C., particularly, from 1050° C. to 1800° C., and more particularly, from 1250° C. to 1800° C. After the heating period, the substrate may be held at the processing temperature, or cooled, either rapidly or slowly. Heating/cooling cycles may be performed repeatedly, typically while maintaining contact of the substrate with the source precursor.

A carrier/diluent gas may be used in combination with the source precursor to facilitate transport or to adjust concentration of the source precursor in the reaction chamber. Helium is a suitable, inert, carrier gas for methane. Many other useful inert carrier gases are known in the art, including, for example, argon and nitrogen. Concentration of the methane source precursor in the chamber may affect the growth of the carbon product; typically, higher concentrations yield higher deposition rates. A methane/helium combination is typically used at a ratio ranging from 0.5 to 27.5, particularly, from 0.5 to 10, and more particularly, from 0.5 to 2.75.

In a basic embodiment, the process consists of rapid transition from a first value of one or more process parameters to a second value of the process parameters over a period of time ranging from 3 seconds to 300 seconds. The process parameters include substrate temperature, reaction chamber gas composition, reaction chamber pressure, gas flow rate, applied electric field strength, and applied magnetic field strength, but the process parameter varied is not solely reaction chamber gas composition. The substrate is heated to a temperature greater than or equal to a decomposition temperature of the one or more source precursor gases.

One type of product that may be produced by the processes of the present invention is the carbon particles of the present invention, termed 'microtrees' or nanotrees', according to size of the particles. The particles comprise carbon and are configured with a base roughly in the shape of an inverted truncated right circular cone. In this context, the term 'inverted cone' is defined as an object having a circular top and tapering to a point at the base. A right circular cone is defined as a solid generated by rotating a right triangle about one of its legs. A different way of stating this is, a right circular cone is a solid bounded by a circular or other closed plane base and the surface formed by line segments joining every point of the boundary of the base to a common vertex. The cone is termed 'truncated' because it generally does not have a point; such a truncated cone could be generated conceptually by slicing off the point of the cone, typically parallel to the plane of the circular top. The diameter of the inverted truncated right circular cone ranges from 1 nm to 100 microns and height of the inverted truncated right circular cone ranges from 5 nm to 1000 microns, yielding an aspect ratio ranging from 5 to 5000. In particular, the diameter ranges from 10 nm to 10 microns, and height from 50 nm to 1000 microns, and more particularly, diameter ranges from 100 nm to 1 micron, and height, from 5 nm to 1000 microns. SEM images of carbon microtrees are shown in FIGS. 1A-H. FIG. 1A shows carbon trees of different heights, which may grow autocatalytically through restructuring of newly deposited carbon surfaces. (The scale bar represents 100 μm.) The particles generally have a head disposed atop the base that is at least partly semispherical, so that the carbon microtrees resemble tiny ice cream cones with the lower tip broken off. This can be seen in FIG. 1A.

Figure 1F:
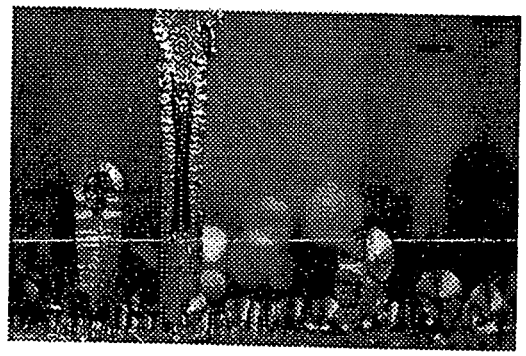

During the process, carbon deposits from the vapor phase as a new graphitic surface with a strong spherulitic (pyrolitic graphite structure) morphology. During growth, several spherulitic nodules that are almost spherical in shape emerge out of the surface. This can be seen in FIG. 1B. Although the inventors do not wish to be held to a particular theory as to how the microtrees and nanotrees are formed, it is believed that the nodules (made of turbostratic graphite layers) are misoriented with respect to each other, and so the rotation of planes at the nodule-nodule interfaces is restricted. This limits the planarization of the surface, hence these nodules serve as the nuclei for subsequent outward growth (FIG. 1B). The trees increase in height with successive cycles until, above a certain critical height, the ends break down into a finer morphology, forming a head, which can be seen in FIG. 1C. Polished cross-sections of the trees, observed by optical microscopy, reveal that the trees are hollow, especially near the base, as shown in FIG. 1F.

Figure 1G:
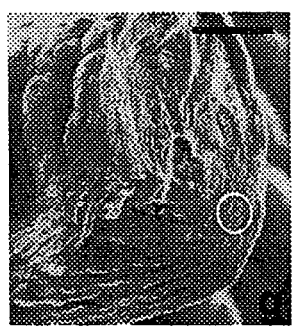

The microtrees also have a layered internal structure. The structure of broken trees and the morphology of craters visible by electron microscopy shows at least two zones. FIG. 1D shows trees broken off at the base, which have given rise to conical craters on the fracture surfaces. These craters show a clear delineation of individual grains that runs normal to the original surface, indicating that adjacent spherulites grew simultaneously upwards during deposition. The outer regions show layering, with layers oriented normally to the tree axis (FIG. 1G).

Figure 6B:
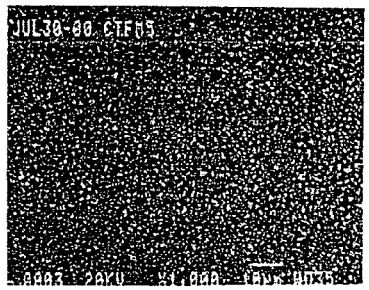
FIGS. 6A-C are SEM images contrasting the morphology of the upper sections with that of the lower sections.
Figure 6A:
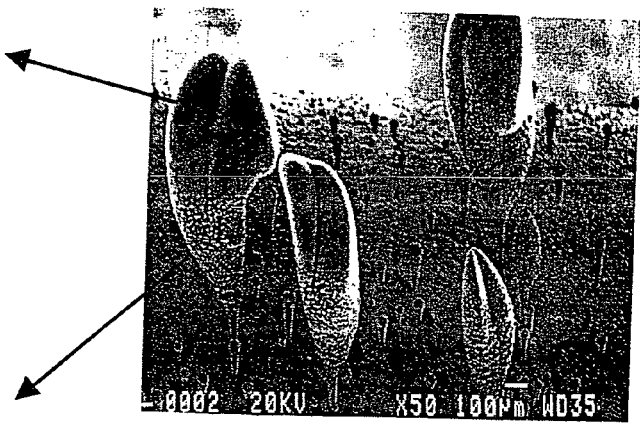
Figure 6C:
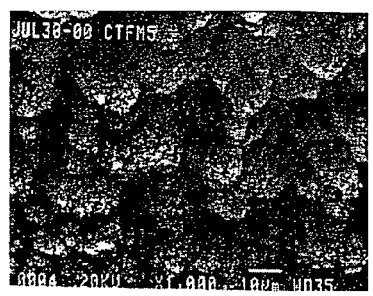

FIGS. 6A-C are SEM images of higher carbon trees showing details of structure with respect to height. Deposition was carried out at 1500° C., with a volume ratio of methane to helium of 1.5. The upper part of the tree shows a fine carbon structure and the lower part shows a coarse structure.

In addition to carbon structures, microtrees and nanotrees having other compositions may be fabricated by the processes of the present invention. These are composed of materials that are capable of forming layered structures, similar to graphite, under non-flash CVD conditions, including hexagonal BN; $B_xC_y$ compositions, where x and y are independently 0, 1, 2, 3 or 4; $B_xC_yN_z$ compositions, where x, y and z are independently 0, 1, 2, 3 or 4; dichalcogenides, for example, $MoS_2$ and $WS_2$; metal oxides, such as $V_2O_5$ and $MoO_3$; metal borides, for example, $MgB_2$; or combinations thereof. Source precursors for these materials are known in the art. See, for example, the review article authored by Gleizes, Alain N. (*MOCVD of Chalcogenides, Pnictides, and Heterometallic Compounds from Single-source Molecule Precursors*, Advanced Materials, 12, pp 155-173 (August 2000)).

The microtrees and nanotrees of the present invention are useful as reinforcements, energy storage structures, and field emission displays.

EXAMPLES

Example 1

Flash CVD of Carbon Microtrees

Graphite electrodes were resistively heated in a standard electric-arc discharge chamber in an atmosphere of methane and helium, at a total pressure of 500 torr for a period of 30 seconds. The temperature of the heated zone on the electrodes ranged from 1100° C. to 2200° C. at the end of the period. An iron catalyst was used.

Figure 1H:
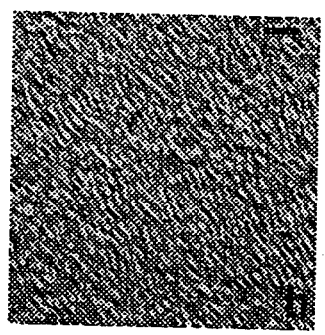

Cross-sectional specimens from individual trees were prepared and studied by transmission electron microscopy (TEM); a representative image is shown in FIG. 1H. Samples were prepared by ultramicrotoming trees embedded in polymer resins, as well as by slicing trees placed on substrates, and were observed by using a focused ion beam microscope. High resolution TEM images of the outer zones show the structure of disordered graphite (FIG. 1H), with an interlayer distance of 0.342 nm, and confirm the general disorientation of layers seen in FIG. 1G. The solid-like center zone shows more disorder (in electron diffraction), indicating that the cores experience lower growth temperatures.

Examples 2-6

General Procedure for Flash CVD Synthesis of Carbon Microtrees

Graphite electrodes were pasted with a ferrocene solution in order to dope the surface with catalytic iron. The electrodes were then mounted in a standard electric-arc discharge chamber as an anode and resistively heated using a Miller Dimension 302 welding power supply for a period of 30 seconds. An atmosphere of methane and helium (1.5/1 ratio, v/v, unless stated otherwise) was admitted to the chamber at a total pressure of 450 torr.

Example 2

Effect of Substrate Temperature on Growth of Carbon Microtrees

Figure 2A:
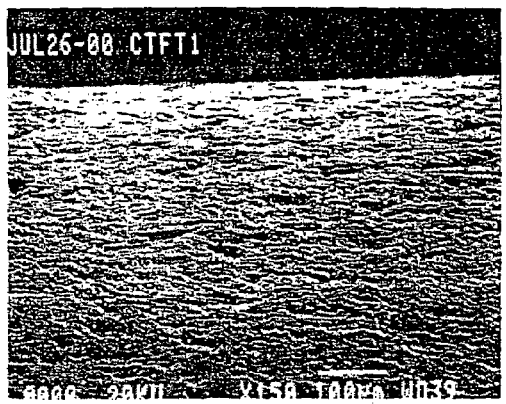
FIGS. 2A-2E are SEM images showing the effect of deposition temperature on growth of carbon microtrees on a graphite surface.
Figure 2B:
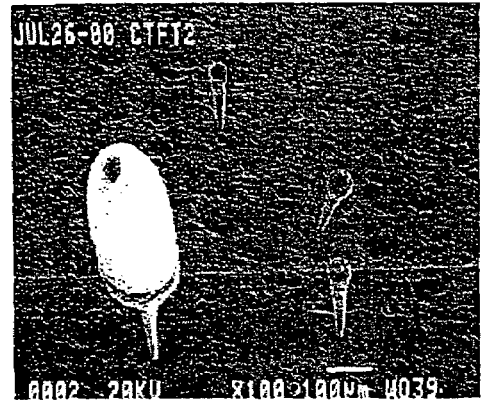
Figure 2C:
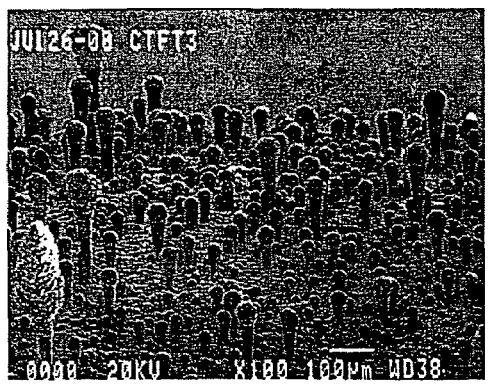
Figure 2D:
Figure 2E:
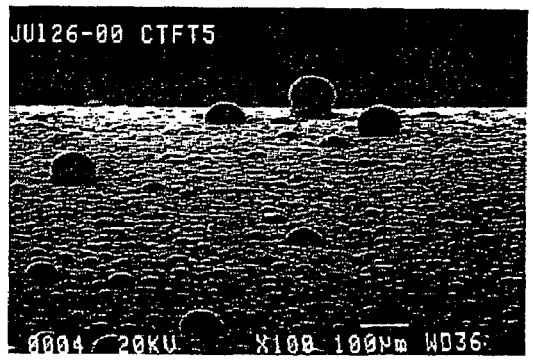
Figure 3A:
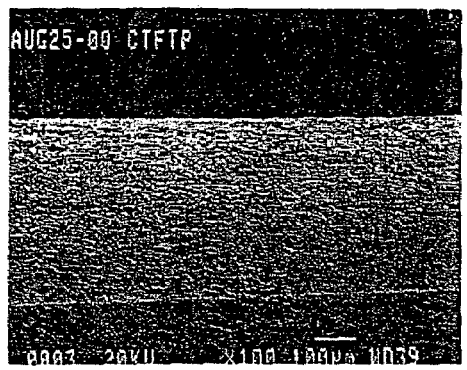
FIGS. 3A-3F are SEM images showing the effect of surface roughness/smoothness on growth of carbon microtrees deposited on a polished graphite surface.
Figure 3B:
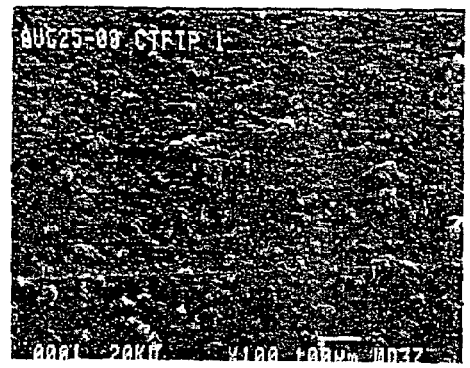
Figure 3C:
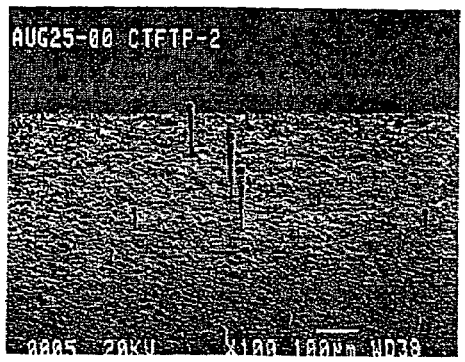
Figure 3D:
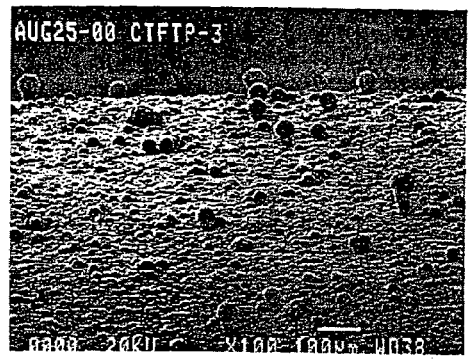
Figure 3E:
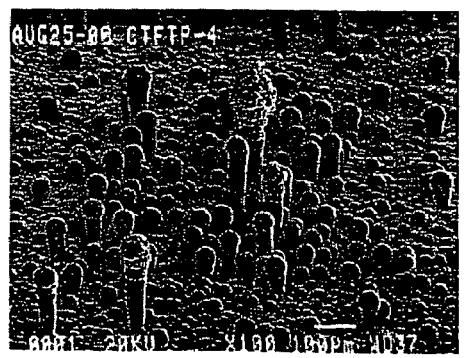
Figure 3F:
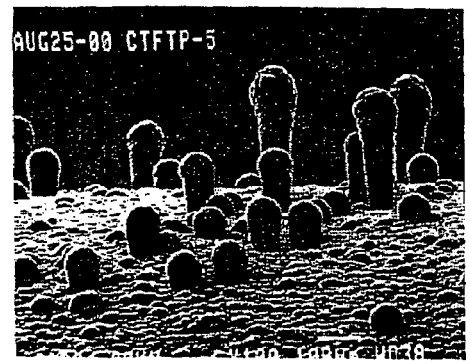

Temperatures evaluated were 1050° C., 1250° C., 1500° C., 1650° C., and 1800° C. SEM images are shown in FIGS. 2A-2E, respectively. It can be seen from the figures that the density of carbon microtrees grown during the CVD processing changes with temperature. At 1050° C., there were no trees or nuclei of trees observed on the electrode surface. FIG. 2A shows the surface of the electrode, which resembles the substrate surface before CVD. With the temperature increase to 1250° C., a few tree-like carbon structures with the average diameter of 22.5 μm appeared on the graphite surface (FIG. 2B). The growth rate of carbon trees perpendicular to the substrate at this temperature was ~190 μm/min. At 1500° C., the highest density of carbon trees and spherulitic nuclei was obtained. The spherulitic nuclei (nodules) in FIG. 2C have a turbostratic graphite structure and could grow to become carbon trees. At successive temperatures (1650, 1800° C.) the density of carbon trees decreased with increasing temperatures, as shown in FIGS. 2D and 2E. However, the diameter of carbon trees increased as the temperature increased, as seen in FIG. 2E, indicating that there are no significant changes in the growth rate.

It is postulated that at lower temperatures (FIG. 2A), there is not enough activation energy for the nucleation of carbon trees. At the higher temperatures, since the deposition rate of carbon atoms on the surface of a graphite substrate is fast, the lamellar pyrolytic carbon growth dominates the surface morphology, resulting in the increasing of the diameter of the graphite electrodes. In this case a smoother surface and fewer carbon trees and spherulitic nuclei are formed. Therefore, as observed in FIG. 2C, a maximum density of carbon trees is reasonably obtained at some intermediate temperature.

Example 3

Effect of Substrate Smoothness on Growth of Carbon Microtrees

Before the deposition, the graphite substrate was polished by mounting the cylindrical electrode in a lathe. The electrode was sanded while the lathe was operated at a speed of 300 rpm, using 600 grit SiC sandpaper. Debris was removed after the sanding with an ethanol wash. SEM images of the deposition surface are shown in FIGS. 3A-3E.

A strong influence of surface roughness on the growth of carbon trees is shown in FIG. 3, using polished graphite electrodes. FIGS. 3A-3F show the same temperature dependence of the growth of carbon trees as in FIG. 2. The overall density of trees and spherulitic nodules was reduced compared to the unpolished electrodes. The maximum in nucleation density was also shifted to a higher temperature compared to the unpolished electrodes as well. When carbon atoms deposited on the smooth surfaces, the growth of lamellar pyrocarbon dominated. Increasing temperature changed the surface morphology into a turbostratic structure where carbon trees and spherulitic carbon could grow. Thus, it is assumed that more thermal energy was required to modify a smooth surface to a rough surface, which is preferred for the nucleation of carbon trees from the turbostratic pyrolytic carbon structure.

Example 4

Effect of Methane Precursor Concentration on Growth of Carbon Microtrees

Figure 4A:
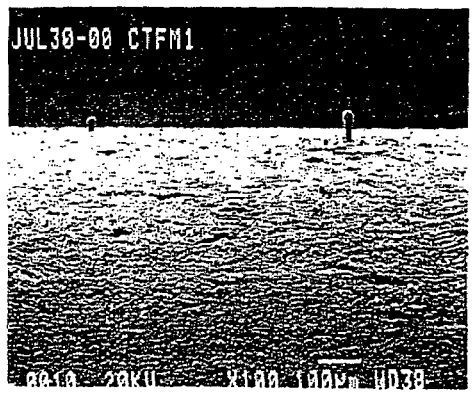
FIGS. 4A-4E are SEM images showing the effect of source precursor concentration on growth of carbon microtrees on a graphite surface.
Figure 4B:
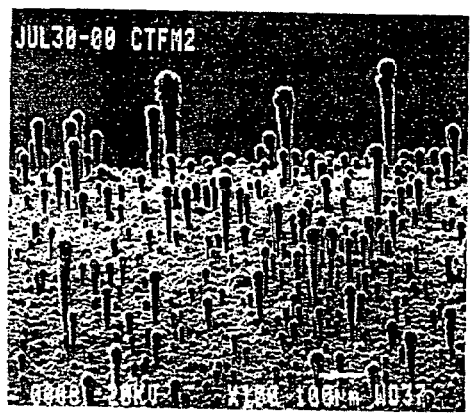
Figure 4C:
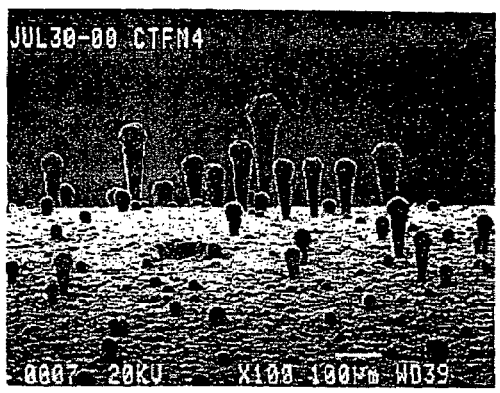
Figure 4D:
Figure 4E:
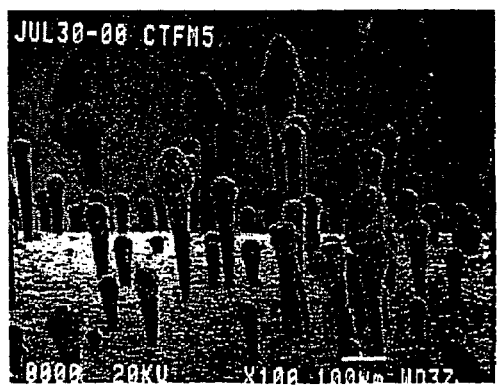

Ratios of methane to helium evaluated were 0.5 (2/1), 0.8 (4/5), 1.5 (3/2), 2.24 (9/4), and 2.75 (11/4). SEM images are shown in FIGS. 4A-4E, respectively. Lower methane concentrations produced a few trees with the growth rate of 30-100 μm/min, as shown in FIG. 4A. With increasing methane concentration, the highest density of carbon trees was obtained at a 0.8:1 ratio (FIG. 4B) with a growth rate of 170~220 μm/min. The density of carbon trees decreased again with increasing methane concentration (FIG. 4C-4E), with a maximum similar to the temperature influence. The growth rate of carbon trees normal to the substrate surface increased rapidly with increasing concentration of methane without changing the area density of carbon trees on the substrate surface (FIG. 4F). At the condition of the highest methane concentration, some of the carbon trees grew very fast and had big heads with different shapes.

It can be seen that the density of carbon trees and the surface morphology of the graphite substrate are not affected much by changing volume of methane gas. It could be assumed that the surface morphology of the graphite substrate is controlled by the temperature effect on the surface rather than volume effect of methane gas. Instead, the growth rate of carbon trees is mainly controlled by the methane volume, as seen in FIG. 4F.

Example 5

Effect of Surface Ferrocene on Growth of Carbon Microtrees

Figure 5:
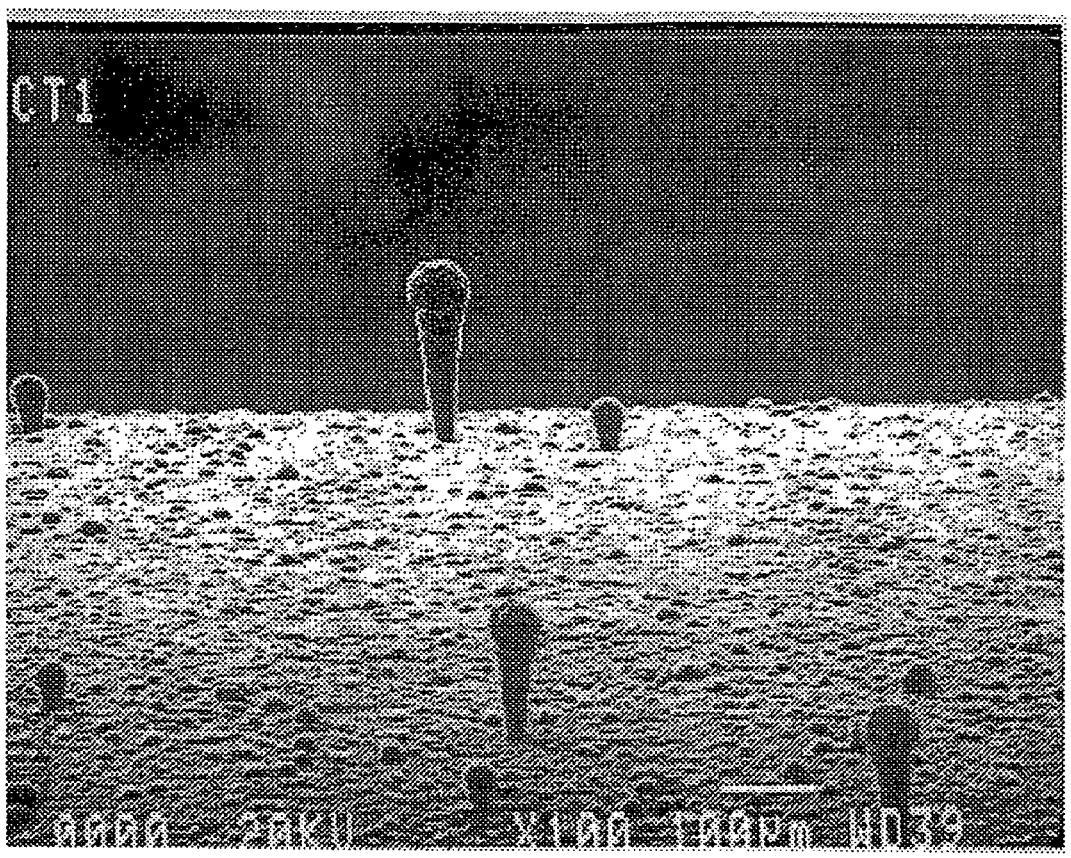
FIG. 5 is a scanning electron micrograph showing the effect of absence of an iron catalyst on growth of carbon microtrees on a graphite surface.

Graphite electrodes that were not pretreated with the ferrocene solution were used for the deposition. The SEM image is shown in FIG. 5. Temperature and atmosphere conditions resulting in the maximum nucleation density in the temperature experiments (1650° C. and 1.4:1 ratio) were used. The results indicate that lower density of carbon trees was obtained without a catalyst than when ferrocene was used as a growth promoter. It was also observed that nanosized iron oxide and other powders could also be used as promoters to grow carbon microtrees efficiently.

Example 6

Morphology of Carbon Microtrees

The morphology of an individual microtree having a larger head portion was examined by SEM; images are shown in FIGS. 6A-C. The microtree, shown in FIG. 6A was fabricated using the procedure described above; deposition temperature was 1500° C. and the volume ratio of methane to helium was 1.5:1.

From the figures, it can be seen that the upper part of the head, (FIG. 6B) has a fine structure while the lower part (FIG. 6C) has a coarser structure. The difference in structure may be due to a temperature gradient along the carbon tree axis. Fast growth of carbon grains, which results in coarse structures, may occur around the lower part of the carbon trees because the highest temperature is near the surface of the carbon electrode.

What is claimed is:

1. A particle comprising a base having a shape of an inverted truncated right circular cone, wherein diameter of the inverted truncated right circular cone ranges from 1 nm to 100 microns, height of the inverted truncated right circular cone ranges from 5 nm to 1000 microns, and aspect ratio of the inverted truncated right circular cone ranges from 5 to 5000.

2. A particle according to claim 1, wherein the diameter ranges from 10 nm to 10 microns.

3. A particle according to claim 2, wherein the diameter ranges from 100 nm to 1 micron.

4. A particle according to claim 1, wherein height of the inverted truncated right circular cone ranges from 50 nm to 1000 microns.

5. A particle according to claim 1, additionally comprising an at least partly semispherical head disposed atop the base.

6. A particle according to claim 1, additionally comprising a layered internal structure.

7. A particle according to claim 1, wherein said base is at least partly hollow.

8. A particle according to claim 1, comprising a material capable of forming one of a planar array, a two-dimensional lattice, or a nanotube.

* * * * *